US008054995B2

(12) United States Patent
Carey

(10) Patent No.: US 8,054,995 B2
(45) Date of Patent: Nov. 8, 2011

(54) SYSTEM, METHOD AND APPARATUS FOR ADJUSTING AN OUTPUT OF A TRANSDUCER

(75) Inventor: Stephen L. Carey, Lafayette, CO (US)

(73) Assignee: Fluxtone, Inc., Lafayette, CO (US)

( * ) Notice: Subject to any disclaimer, the term of this patent is extended or adjusted under 35 U.S.C. 154(b) by 1169 days.

(21) Appl. No.: 11/768,484

(22) Filed: Jun. 26, 2007

(65) Prior Publication Data

US 2008/0101629 A1 May 1, 2008
US 2010/0220873 A2 Sep. 2, 2010

Related U.S. Application Data

(60) Provisional application No. 60/817,968, filed on Jun. 30, 2006.

(51) Int. Cl.
*H03F 99/00* (2009.01)

(52) U.S. Cl. .......... 381/120; 381/406; 381/339; 381/55; 381/111; 381/116; 330/278; 330/279; 330/297; 330/51; 330/199

(58) Field of Classification Search .................. 381/120, 381/339, 406, 55, 111, 116; 330/278, 279, 330/297, 51, 199
See application file for complete search history.

(56) References Cited

U.S. PATENT DOCUMENTS 5,487,114 A * 1/1996 Dinh ............................ 381/406
6,639,994 B1 * 10/2003 Proni et al. .................... 381/406

FOREIGN PATENT DOCUMENTS

GB 414352 A * 7/1934
GB 414352 A 10/2004

OTHER PUBLICATIONS

Athina Nickitas-Etienne, Notification Concerning Transmittal of International Preliminary Report on Patentability, Mailed Jan. 14, 2010.
"'Speaker Clank' and the 'Physical' Sound," Author Unkown, obtained from www.aptone.com, May 12, 2006.
International search Report, Mailed Jun. 20, 2008, PCT/US2007/072438, Blain R. Copenheaver.
Public Disclosure Information for WeberVST Products, Aiuthor Unknown, May 3, 2004,obtained from http://www.webervst.com/public.htm.

* cited by examiner

*Primary Examiner* — Xu Mei
*Assistant Examiner* — Paul Kim
(74) *Attorney, Agent, or Firm* — Neugeboren O'Dowd PC

(57) ABSTRACT

A system and method for modulating the sound pressure that is output from an audio transducer is disclosed. In one embodiment, the method includes receiving an audio signal and placing the audio signal across a voice coil of the transducer. In addition, a voltage is applied across a field coil of the transducer, the field coil being separate from the voice coil. And the voltage that is applied across the field coil is adjusted so as to modulate the sound pressure output from the audio transducer.

17 Claims, 7 Drawing Sheets

SYSTEM, METHOD AND APPARATUS FOR ADJUSTING AN OUTPUT OF A TRANSDUCER

PRIORITY

The present application claims priority to provisional patent application No. 60/817,968, filed Jun. 30, 2006 entitled: System, Method, and Apparatus for Adjusting an Output of an Audio Amplifier, which is incorporated by reference herein in its entirety.

FIELD OF THE INVENTION

The present invention relates to systems and methods for modulating audio signals. In particular, but not by way of limitation, the present invention relates to systems and methods for modulating sound pressure level output from an audio transducer.

BACKGROUND OF THE INVENTION

Since the inception of the electric guitar, guitarists have created overtones by overdriving amplifiers, and many guitarists use these overtones as a stylized element of their music. In particular, many musicians deliberately turn up a vacuum tube amplifier to the point where distortion (e.g., clipping) is clearly audible in the output signal. This distortion may range from a slight added "edge" with some increase in sustain, up to a thick fuzzy sound whose tonality is almost unrecognizable as that of the input signal. Although the overdriving of amplifiers is predominantly used with an electric guitar, some have also used it with the bass guitar or even a keyboard.

These artists, however, face the dilemma of either being able to preserve these overtones in their music or being able to adjust the volume of the output amplifier to lower levels where the overtones are not produced. Guitarists, for example, often times must sacrifice these desired overtones because the volume at which their amplifiers produce these overtones in simply too loud for small clubs, recording studios, townhouses or apartments.

Many circuit designs and additional components have been created in an attempt to simulate the overtones that occur when an amplifier is overdriven without actually overdriving the amplifier. For example, commercial devices have been developed and sold that either change or add circuitry in the path which the audio signal travels. More specifically, devices have been developed that generate signals that attempt to replicate the overtones that are created when an amplifier is overdriven. These replications, however, typically do not provide the same quality of overtones that are naturally produced by an overdriven amplifier.

Alternatively, many modern guitar amplifiers have a preamplifier stage, which can be made to distort heavily and the final output volume can be controlled by changing the gain on the later stage(s) of amplification. This approach, however, only introduces class A-type distortion from the preamplifier and does not enable the distortions created by an overdriven output stage, which many artists are most interested in, to be introduced into the audio signal.

Moreover, even when a tube amplifier is not overdriven, there are inherent distortions created when a tube amplifier drives a transducer, and many musicians desire to maintain these distortions as well. Accordingly, a method and an apparatus are needed to overcome the shortfalls of present technology.

SUMMARY OF THE INVENTION

In accordance with one embodiment, the invention may be characterized as an apparatus for modulating the sound pressure output from an audio transducer, the apparatus comprising: an input configured to receive an audio signal, the audio signal including a plurality of frequencies; an audio transducer including a voice coil and a field coil, wherein the field coil is separate from the voice coil; and a user-adjustable power supply coupled to the field coil of the audio transducer. The user-adjustable power supply in this embodiment is configured to provide an adjustable voltage across the field coil so as to enable the sound pressure output from the audio transducer to be modulated.

In another embodiment, the invention may be characterized as a system and method for modulating the sound pressure that is output from an audio transducer. The method in this embodiment including: receiving an audio signal, the audio signal including a plurality of frequencies; placing the audio signal across a voice coil of the transducer; applying a voltage across a field coil of the transducer that is separate from the voice coil; and adjusting the voltage that is applied across the field coil so as to modulate the sound pressure output from the audio transducer.

In accordance with yet another embodiment, the invention may be characterized as a system and method for retrofitting a musical instrument amplifier. The method in this embodiment includes replacing a permanent-magnet-transducer in the musical instrument amplifier with a transducer that includes a voice coil and a field coil, the field coil being a separate coil from the voice coil; and adding a user-adjustable power supply to the amplifier that is configured to couple to the field coil of the amplifier, so as to enable a user to adjust a magnitude of a magnetic field that is generated by the field coil.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings wherein:

DETAILED DESCRIPTION

Figure 1:
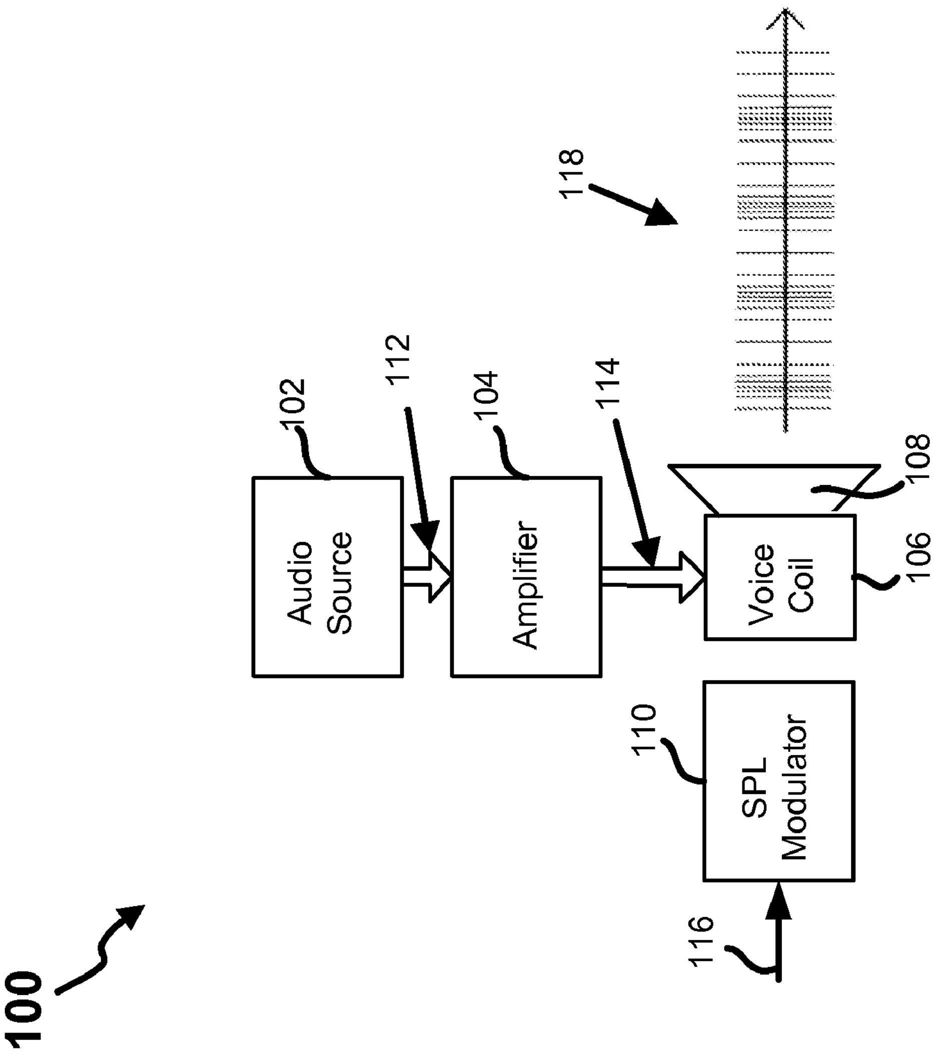
FIG. 1 is a block diagram of one embodiment of the present invention.

Referring to FIG. 1, shown is a block diagram 100 depicting an exemplary embodiment of the present invention. As shown, an audio source 102 is coupled to an amplifier 104, and the amplifier 104 is coupled to a voice coil 106 of a transducer 108. As depicted, a sound pressure level (SPL) modulator 110 is magnetically coupled to the voice coil 106. It should be recognized that the illustrated arrangement of these components is logical and not meant to be an actual hardware diagram. Thus, the components can be combined or further separated in an actual implementation. As discussed further herein, for example, the amplifier 104 transducer 108 and SPL modulator 110 may reside within the same housing as integrated components of an musical instrument amplifier, and in other embodiments, the SPL modulator 110 and transducer 108 may be housed separately from the amplifier 104.

Moreover, the construction of each individual component—in light of this disclosure—is well within the understanding of those with ordinary skill in the art. The audio source 102, for example, may be any device (e.g., guitar, piano, violin, keyboard or other musical instrument) that outputs an audio signal 112 intended to be amplified and converted into an audio signal 114 that is amplified.

As depicted in FIG. 1, the amplifier 104 generally receives the audio signal 112 from the audio source 102, amplifies the audio signal 112 to generate an amplified audio signal 114 that is provided to the voice coil 106. As discussed further herein, the amplifier 104 may be realized by a musical instrument amplifier that carries out a plurality of amplification steps and/or signal processing (e.g., sound-effect processing). In other embodiments, however, the amplifier 104 may be one among other amplifiers that are in the signal path 112, 114 between the audio source 102 and the voice coil 106. To be more specific, the block diagram 100 is certainly not intended to depict the many potential components that may be interposed in the signal path 112, 114 from the audio source 102 to the voice coil 106.

In general, the SPL modulator 110 is configured to vary, based upon an input 116 to the SPL modulator 110, the sound pressure level of sound waves (also referred to as a pressure waves) 118 that are generated by the transducer 108. As one of ordinary skill in the art appreciates, the amplified audio signal 114 includes a plurality of frequencies. Although not required, the plurality of frequencies may include desirable overtones that are generated by overdriving the amplifier 104 (e.g., a tube amplifier). Moreover there may be sound effects or other alterations made to the content of the audio signal, and as a consequence, it should be recognized that the frequency content and/or other characteristics of the amplified audio signal 114 may differ from the audio signal 112 received from the audio source 102.

As one of ordinary skill in the art will appreciate, it is desirable for the frequency content of the audio signal 114 to be accurately represented in the sound waves 118. Beneficially, and unlike many known techniques for varying sound levels, the SPL modulator 110 modulates the sound pressure level of the sound waves 118 (e.g., audible sound) from outside of the signal path 112, 114 between the audio source 102 and the voice coil 106. And as a consequence, the SPL modulator 110 varies the sound pressure level of the sound waves 118 without adversely affecting the desired spectral content of the sound waves 118.

In operation, the amplified and/or processed version 114 of the audio signal 112, when coupled to the voice coil 106, creates a varying magnetic field that is generally disposed about the voice coil 106. And the SPL module 110 is configured to apply, responsive to the input 116, an adjustable magnetic field that interacts with the magnetic field generated from the voice coil 106 so as to create relative movement between the SPL module 110 and the voice coil 106. The extent of the relative movement between the SPL module 110 and the voice coil 106, and hence the sound pressure level of the sound waves 118, is a function of the adjustable magnetic field generated from the SPL modulator 116. Thus a user (e.g., musician) may simply adjust an input 116 to the SPL modulator 110 and the sound pressure level of the sound waves 118 is adjusted with an insubstantial effect upon the content of the audio signal 114, which enables an accurate representation of the audio signal 114 to be enjoyed at a variety of sound pressure levels (also referred to as volume levels).

Figure 2:
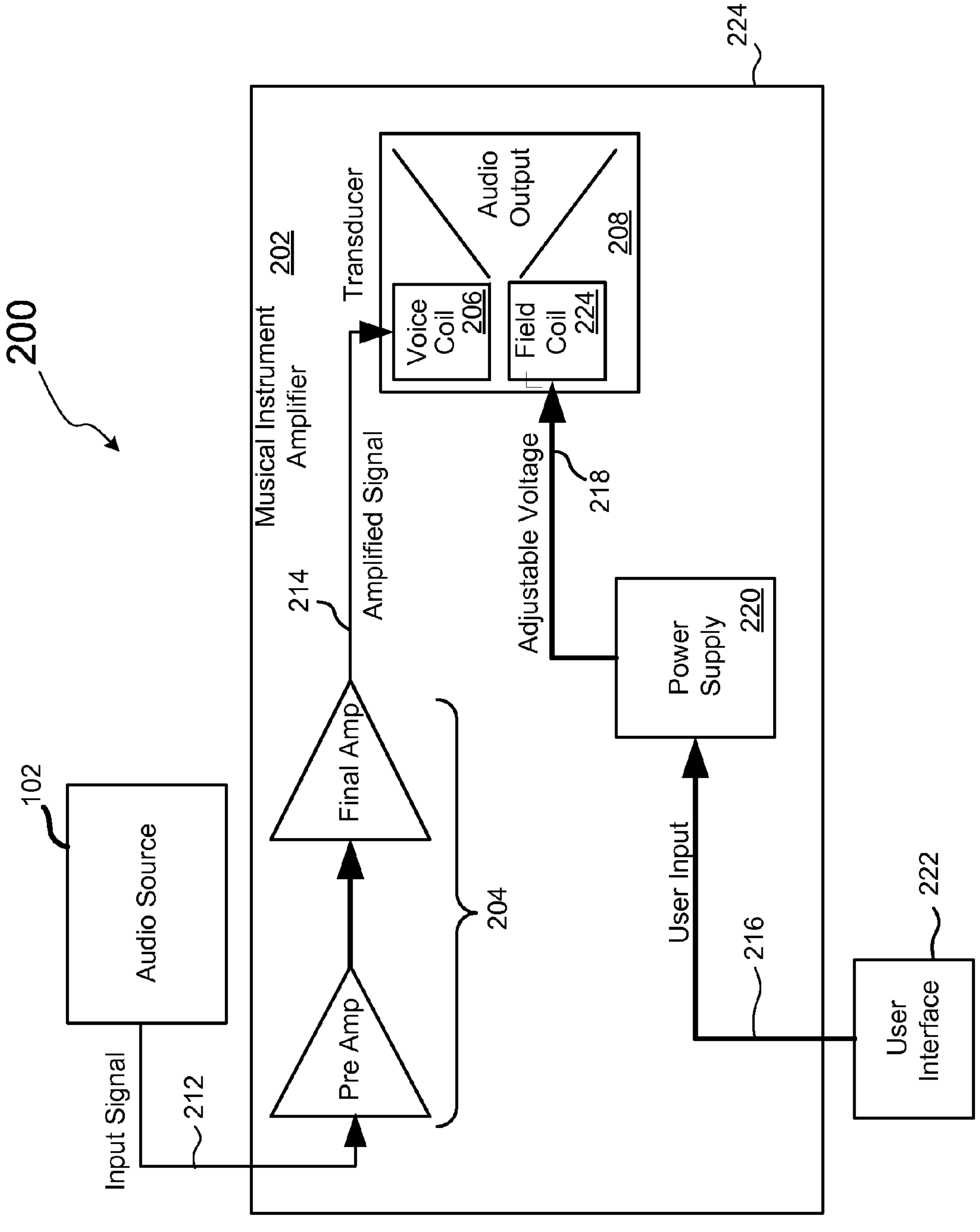
FIG. 2 is a block diagram depicting an exemplary embodiment of a musical instrument amplifier.

Referring next to FIG. 2, it is a block diagram 200 depicting an exemplary embodiment of a musical instrument amplifier 202. As shown, the musical instrument amplifier 202 includes an input to receive an audio signal 212 derived from the audio source 102, at least one amplifier 204 (e.g., a pre amplifier and a final amplifier), a transducer 208 and a power supply 220. As shown, the transducer 208 in this embodiment includes a voice coil 206 and a field coil 224, and the SPL module 110 described with reference to FIG. 1, is realized by the power supply 220 and the field coil 224. The field coil 224 of the transducer 208 in this embodiment is configured to provide an adjustable magnetic field.

As shown, an input 216 is provided by a user interface 222 to the power supply 220, and the power supply 220 provides an adjustable voltage 218 to the field coil 224 according to the user input 216 so as to vary the magnetic flux density of the magnetic field generated by the field coil 224. As shown, the amplified signal 214 is coupled to the voice coil 206 to create a varying magnetic field that interacts with a magnetic field generated from the field coil 224 so as to create relative movement between the field coil 224 and the voice coil 206. As one of ordinary skill in the art will appreciate, movement of the voice coil 206 is translated into an audio signal that corresponds to the amplified signal 214. As shown, the intensity of the magnetic field of the field coil 224 may be adjusted by adjusting the power that the power supply 220 provides to the field coil 224. And, by adjusting the magnetic field of the field coil 224, the volume of the audio signal generated by the transducer 208 may be adjusted.

Beneficially, enabling an adjustment to the magnetic field of the field coil allows the volume of the audio output by the transducer 208 to be adjusted without adversely affecting the tonal quality of the amplified signal 214 fed to the transducer 208. As a consequence, the integrity of the overtones created by overdriving the amplifier 204 may be retained while reducing the volume of the audio from the transducer 208—enabling the overtones to be enjoyed at a lower volume.

It should be recognized the components within the musical instrument amplifier 202 can be combined or further separated in an actual implementation. For example, it is contemplated that the power supply 220 and transducer 208 may be implemented as an assembly and distributed as a unit for purposes of retrofitting typical musical instrument amplifiers. As described further herein, for example, the permanent-magnet-transducer of a typical musical instrument amplifier may be replaced with the transducer 208 depicted in FIG. 2 and the power supply 220 may be added to the retrofitted musical instrument amplifier to drive the transducer 208. It should also be recognized that the pre-amp and final amp depicted in FIG. 2 are merely exemplary of the multiple types of amplifier components that may be used in the amplifier, and may be realized by transistors, tubes or a combination thereof.

The power supply 220 may be realized by an adjustable power supply with a 120 VAC input and an output of zero to 400 VDC, but this is certainly not required and the input voltage, as well as the range of output voltages, may vary. In many other embodiments for example, the power supply 220 is implemented at least in part by a switch mode power supply that provides a voltage that is less than 36 Volts, and as a consequence, lethal voltages are removed and certain costly precautions that are required by code at voltages over 36 Volts may be avoided. And in one embodiment 0 to 12.5 VDC is provided to the field coil 224. In one particular embodiment, the power supply 220 may be realized by a 14 VDC switch mode power supply provided, for example, by Leader Electronics Inc. that is adapted with a aftermarket Darlingtin pass transistor to provide 0 to 12.5 VDC responsive to the user interface 222, And the user interface 222 may be realized by an audio-taper potentiometer, or a rotary selector switch, that is provided as a knob on a housing 224 of the musical instrument amplifier 202 to enable a user to adjust an output of the power supply 220. Alternatively, the user interface 222 may be integrated with the power supply 220. Moreover, the power supply 220 may be located outside of a housing 224 of the musical instrument amplifier and may be electrically isolated (e.g., galvanically isolated) from the amplifier(s) 204 as well.

Figure 3:
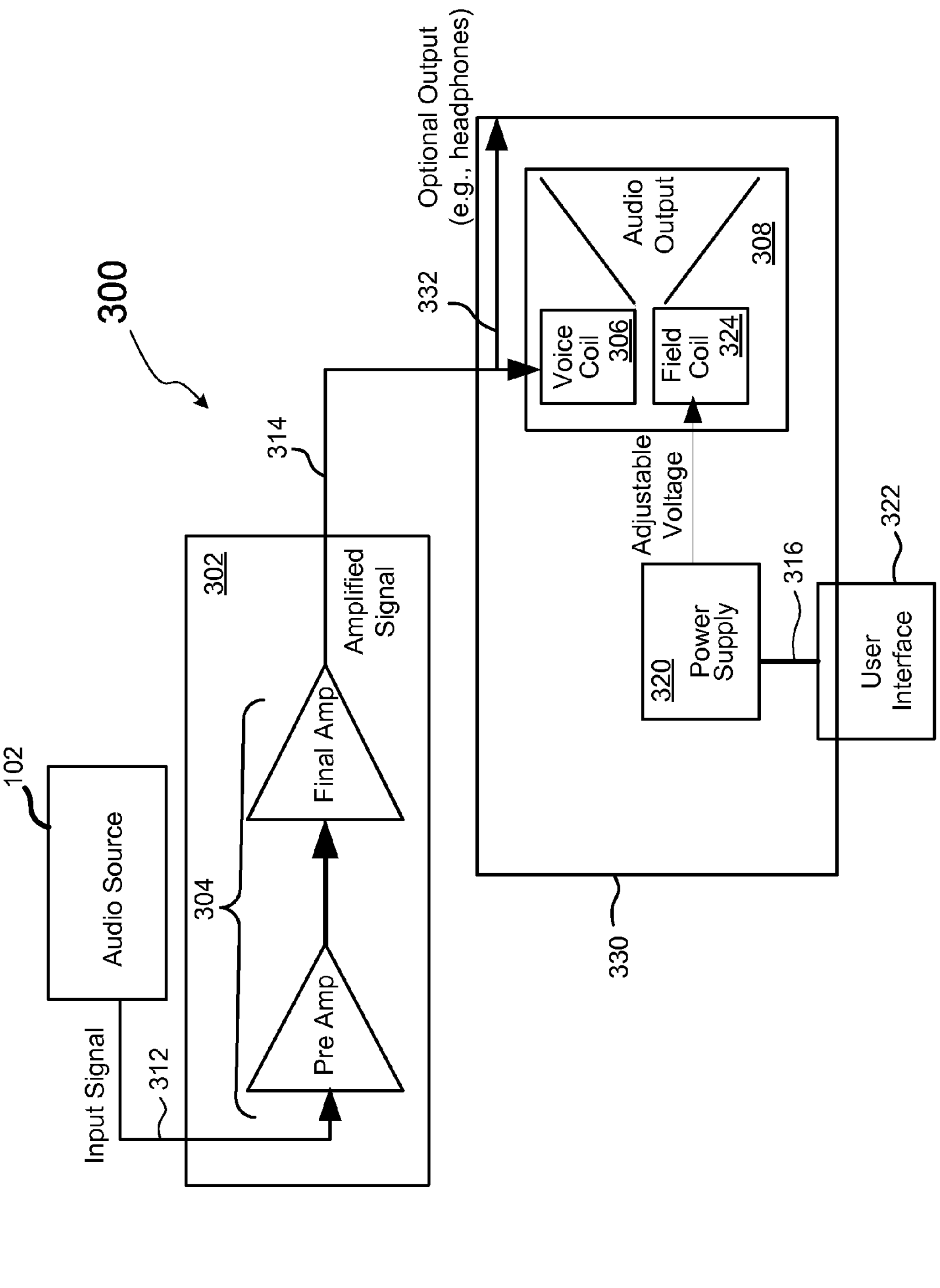
FIG. 3 is a block diagram depicting an embodiment in which the sound pressure modulator described with reference to FIG. 1 is implemented separately from a musical instrument amplifier.

Referring next to FIG. 3, it is a block diagram 300 depicting an embodiment in which the sound pressure modulator 110 described with reference to FIG. 1 is implemented separately from a musical instrument amplifier. As shown, the musical instrument amplifier 302 in this embodiment includes an input to receive an audio signal 312 derived from the audio source 102, at least one amplifier 304 (e.g., a pre amplifier and a final amplifier), and provides an amplified audio signal 314 to a separate sound pressure modulation unit 330. And the sound pressure modulation unit 330 in this embodiment includes a transducer 308 and a power supply 320. As shown, the transducer 308 in this embodiment includes a voice coil 306 and a field coil 324, and the SPL module 110 described with reference to FIG. 1, is realized by the power supply 320 and the field coil 324. As depicted in FIG. 3, the sound pressure modulation unit 330 in this implementation also includes an optional output 332 that enables a user to listen to the received audio signal 314 with signal level audio circuits, for example, headphones, or input to a recording device.

The transducer 308, power supply 320 and user interface 322 in this embodiment may be realized by the same components as the transducer 208, power supply 220 and user interface 222 described with reference to FIG. 2. And the power supply 320 and the field coil 324 operate in response to the user interface 322 in a similar manner as the power supply 220 and field coil 224 operate in response to the user interface 222 as described with reference to FIG. 2. In addition, the pre-amp and final amp depicted in FIG. 3 are merely exemplary of the multiple types of amplifier components that may be used in the musical instrument amplifier 302, and may be realized by transistors, tubes or a combination thereof.

In many embodiments, the transducers 208, 308 described with reference to FIGS. 2 and 3 apply a variable magnetic field to a voice coil without the use of fixed magnet. And as a consequence, the sound pressure level that is output by a transducer may be varied by approximately 25 dB.

Figure 7:
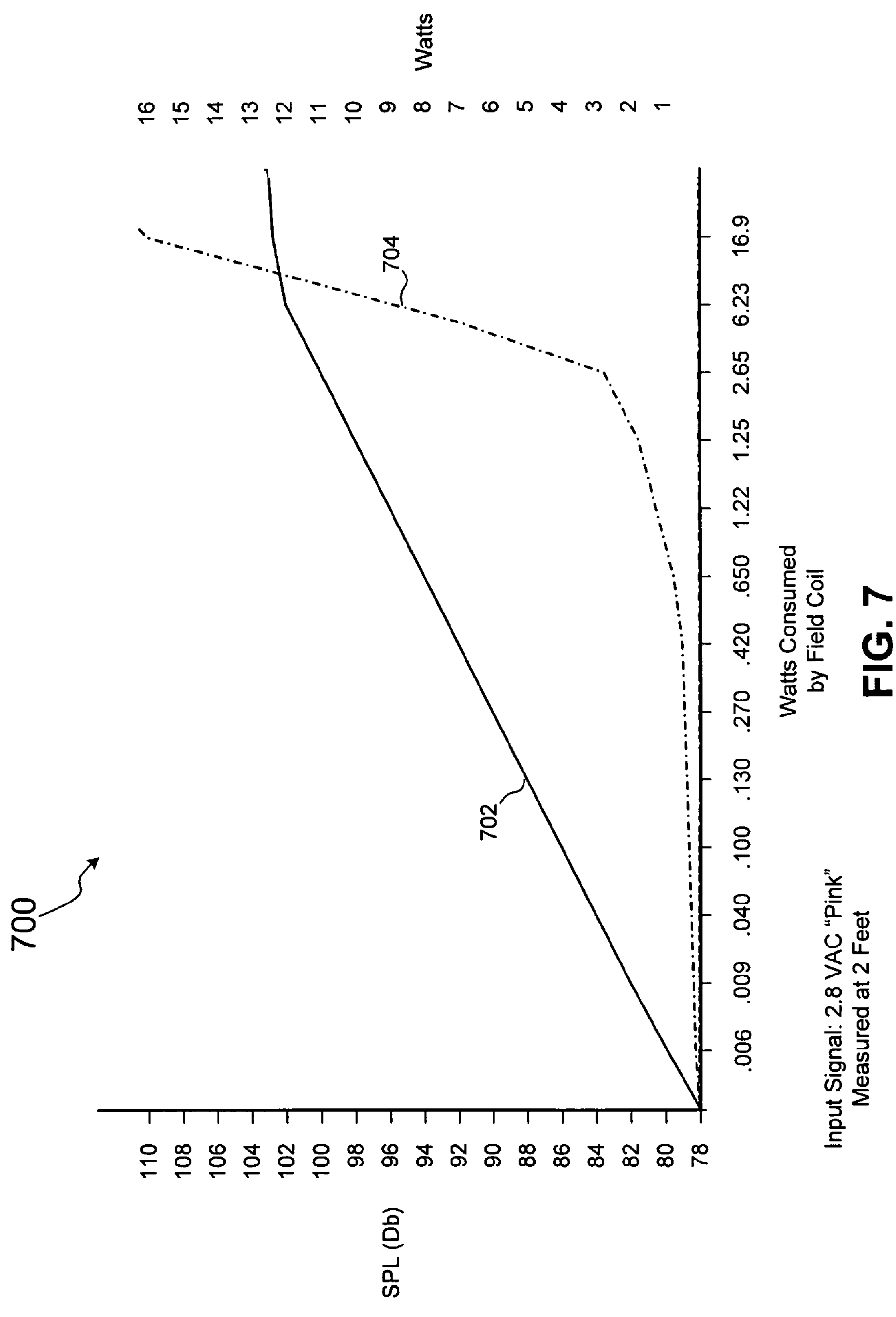
FIG. 7 is a graph depicting sound pressure level of an audio signal that is output by an audio transducer versus power that is input to a field coil of the audio transducer.

Referring briefly to FIG. 7 for example, shown is a graph depicting sound pressure level 702 output of a transducer that does not include a fixed magnet (e.g., to apply a magnetic field to the magnetic field generated by a voice coil). As shown, the graph depicts sound pressure level 702 versus power (Watts) 704 applied to a field coil that is modulated in accordance with many embodiments of the present invention. In particular, an input signal comprising pink noise at 1 Watt was provided to a voice coil of a transducer and the power provided to the field coil was modulated from between approximately 0 Watts and 16.9 Watts. As shown, the sound pressure level of an audio signal may be varied by approximately 25 dB by varying the wattage applied to the field coil from approximately zero Watts to approximately 17 Watts.

To provide the broad range of sound-pressure-level outputs depicted in FIG. 7, the magnetic field (e.g., derived from a field coil) that is applied to the magnetic field generated by the voice coil is reduced to approximately zero Tesla by applying nearly zero watts to the field coil. Said another way, if a fixed magnetic field were provided (e.g., by a fixed non-adjustable magnet) to the magnetic field generated by a voice coil, the range of sound pressure levels that could be output from the transducer would be substantially reduced. As shown in FIG. 7, for example, if a relatively small field (e.g., a field generated from just 0.420 Watts) were constantly applied (e.g., by a field coil or a rare-earth magnet), the range of potential sound pressure level outputs would be reduced to about 11 db (from about 92 dB to about 103 dB. As a consequence, in many embodiments it is beneficial to enable the magnitude of the magnetic field that is applied to the magnetic field of the voice coil to be reduced to a very low level and/or completely removed.

Figure 4:
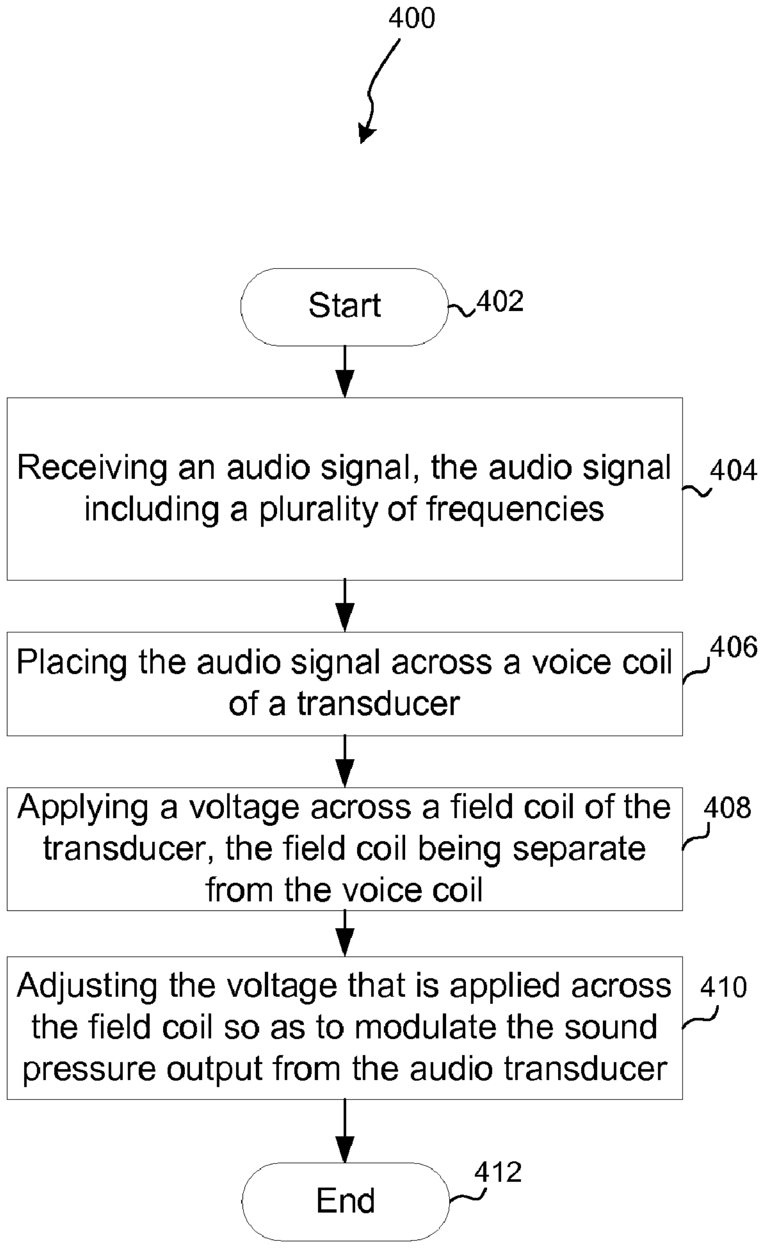
FIG. 4 is a flowchart of one method for modulating the sound pressure level of a transducer.

Referring next to FIG. 4, shown is a flowchart 400 depicting an exemplary method for modulating the sound pressure level of a transducer that may be used in connection with the embodiments described with reference to FIGS. 1-3. Although reference is made to the embodiments in FIGS. 1-3, it should be recognized the method depicted in FIG. 4 is certainly not limited to be carried out by the exemplary embodiments of FIGS. 1-3.

As shown in FIG. 4, an audio signal (e.g., audio signal 114, 214, 314) that includes a plurality of frequencies is received (e.g., by amplifier 104, 204, 304) (Blocks 402, 404) and then placed across a voice coil (e.g., voice coil 206, 306) of the transducer (e.g., transducer 208, 308) (Block 406). In addition, a voltage (e.g., voltage 218, 318) is applied to a field coil (e.g., field coil 224, 324) of the transducer that is separate from the voice coil (Block 408). And then to modulate the sound pressure level that is output by the transducer, the voltage that is applied to the field coil is adjusted (Block 410, 412).

Figure 5:
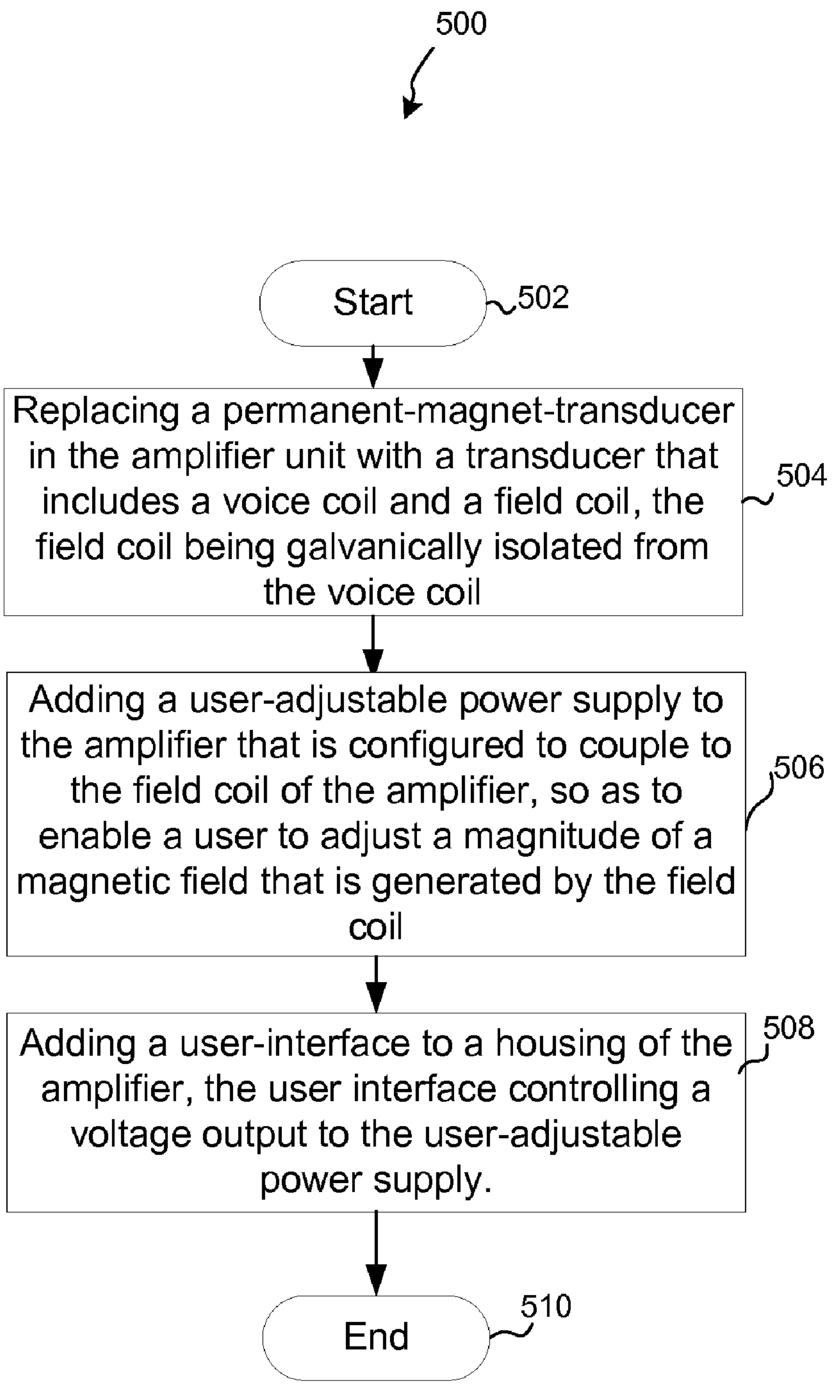
FIG. 5 is a flowchart depicting a method for retrofitting a typical musical instrument amplifier.

Referring next to FIG. 5, it is a flowchart 500 depicting an exemplary method for retrofitting a typical musical instrument amplifier. As shown, a fixed-magnet-transducer in the musical instrument amplifier is replaced with a transducer that includes both a voice coil and a field coil, and the field coil is galvanically isolated from the voice coil (Block 504). In addition, a user-adjustable power supply is added to the amplifier that is configured to couple to the field coil of the amplifier in order to enable a user to adjust a magnitude of a magnetic field that is generated by the field coil (Block 506). And as depicted in FIG. 5, a user-interface may be added to a housing of the musical instrument amplifier to control a voltage output to the user-adjustable power supply (Blocks 508, 510). In some implementations, for example, the voltage output by the power supply varies nonlinearly relative to motion of the user-interface, and the sound pressure level output by the transducer varies linearly with the motion of the user-interface.

Figure 6:
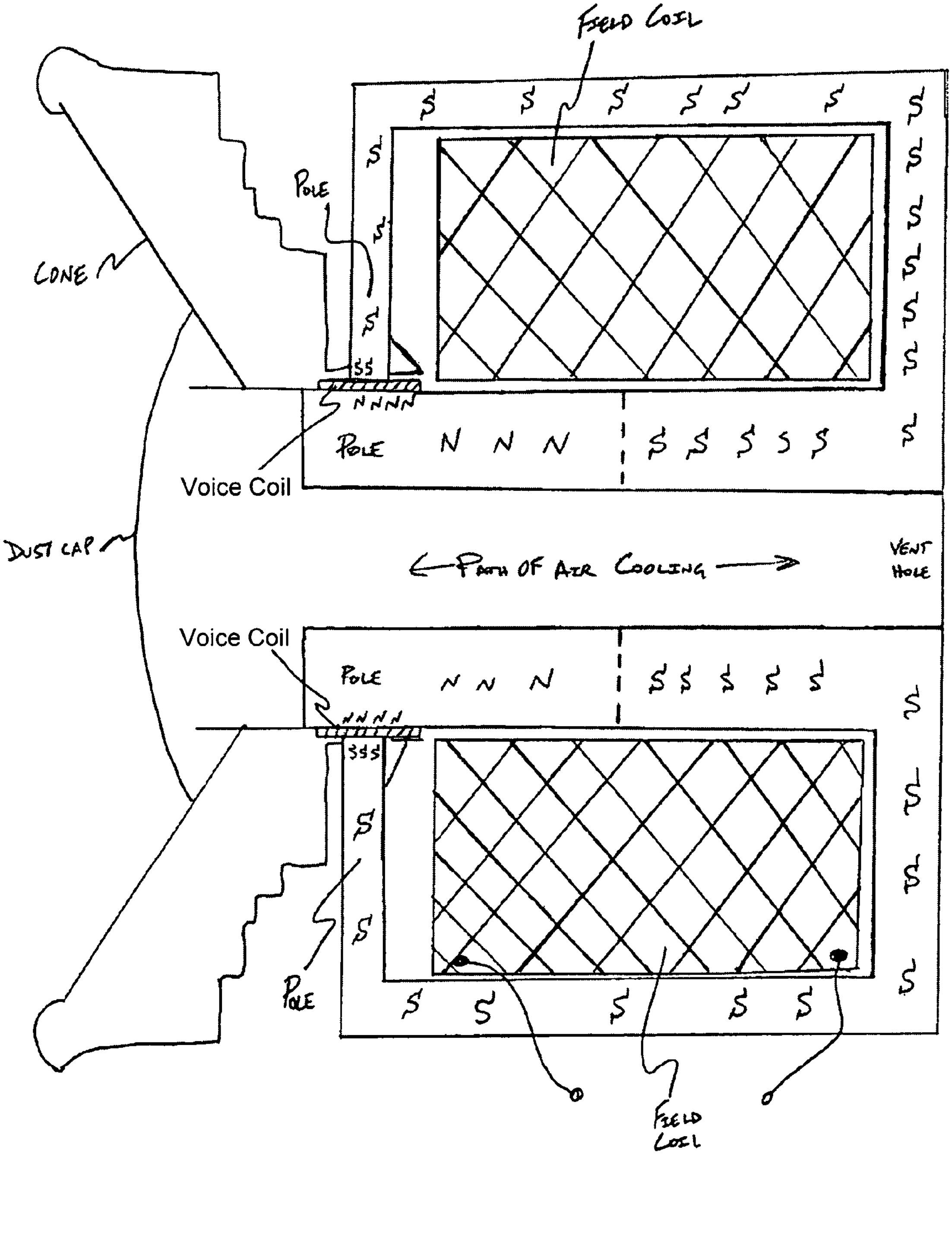
FIG. 6 is a cutaway view of an exemplary audio transducer that may be used in connection with embodiments of the present invention.

Referring next to FIG. 6, depicted is a cutaway view of an audio transducer with a field coil that is wrapped around pole pieces that provide a magnetic circuit for the field generated by the field coil. As depicted, the gap in the pole pieces allows the voice coil to be moveably interposed in the magnetic circuit of the field coil so that the voice coil, and hence the cone of the transducer, are able to move responsive to the interplay of the magnetic field of the voice coil and the magnetic field of the field coil. As depicted, the field coil sets up opposing fields (depicted by "N" and "S") on both sides of the voice coil. It should be recognized that the depiction of the poles is merely to show how a field may be set up across the voice coil and that the poles may be reversed by simply reversing the connections of the field coil to the power supply. Although the transducer in this embodiment includes a hollow air cooling path in the center pole, this is certainly not required, and in other embodiments the center pole is solid and cooling is provided by, for example, a heat sink and/or metal basket.

Although not required, the field coil may be realized by many different wire gauges (e.g., 20, 24, or 26 gauge wire) and wire types (e.g., enamel coated wire) wrapped around bobbins that slide over pole pieces that are disposed so that the voice coil is interposed within a magnetic circuit formed by the pole pieces and the field coil.

In conclusion, the present invention provides, among other things, a system and method for modulating the volume of an audio transducer without adversely affecting the quality of the amplified signals. Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms.

What is claimed is:

1. A method for modulating the sound pressure that is output from an audio transducer, the method comprising:

receiving an audio signal with an amplifier, the audio signal including a plurality of frequencies, the audio signal generated by a musical instrument;

adding harmonics to at least one of the plurality of frequencies by overdriving the amplifier;

placing the audio signal across a voice coil of the transducer after the adding of the harmonics;

applying a voltage across a field coil of the transducer, the field coil being separate from the voice coil, and the voltage across the field coil being independently controlled from the audio signal across the voice coil; and adjusting the voltage that is applied across the field coil so as to modulate the sound pressure output from the audio transducer.

2. The method of claim 1, wherein the audio signal includes frequencies generated by a vacuum tube amplifier.

3. The method of claim 1, wherein the voltage applied across the field coil is between 0 and 36 Volts.

4. The method of claim 3, wherein the voltage applied across the field coil is between 0 and 12.5 VDC.

5. The method of claim 1, wherein adjusting the voltage that is applied across the field coil includes adjusting the voltage with a user interface; and nonlinearly adjusting the voltage that is applied across the field coil relative to movement of the user interface.

6. The method of claim 1 including:

reducing a magnitude of a magnetic field applied to the voice coil to substantially zero.

7. An apparatus for modulating the sound pressure output from an audio transducer, the apparatus comprising:

an input configured to receive an audio signal, the audio signal including a plurality of frequencies;

an audio transducer including a voice coil and a field coil;

an amplifier disposed between the input and the voice coil of the audio transducer, the amplifier configured to amplify the audio signal and introduce a harmonic of at least one of the plurality of frequencies into the audio signal when the amplifier is overdriven, and to provide the overdriven audio signal to the voice coil; and a user-adjustable power supply coupled to the field coil of the audio transducer, the user-adjustable power supply configured to provide an adjustable voltage across the field coil so as to enable the sound pressure output from the audio transducer to be modulated.

8. The apparatus of claim 7 including at least one other power supply that is configured to power the amplifier, the at least one other power supply being electrically isolated from the user-adjustable power supply.

9. The apparatus of claim 8, wherein the user-adjustable power supply is configured to provide substantially zero volts to the field coil, and wherein a magnetic field of approximately zero Tesla is applied to the voice coil when the power supply is providing substantially zero volts to the field coil.

10. The apparatus of claim 7, wherein the user-adjustable power supply is configured to provide a voltage across the field coil that is between 0 and 36 VDC.

11. The apparatus of claim 10, wherein the user-adjustable power supply is configured to provide a voltage across the field coil that is between 0 and 12.5 VDC.

12. A method of controlling the output of a transducer comprising:

receiving an audio signal, the audio signal including a particular collection of frequencies;

passing the audio signal through an overdriven amplifier thereby adding harmonics to at least one of the frequencies of the particular collection of frequencies to produce an overdriven audio signal;

providing the overdriven audio signal along a signal path to a voice coil of the transducer;

applying a magnetic field to the voice coil, the applied magnetic field independently controlled from a magnetic field of the voice coil, and the applied magnetic field insubstantially affecting a content of the overdriven audio signal in the signal path; and controlling a magnitude of the applied magnetic field so as to alter a sound pressure level of an audible signal generated by a portion of the transducer that is coupled to, and moves with, the voice coil.

13. The method of claim 12, wherein the controlling includes reducing a magnitude of the applied magnetic field to approximately zero Telsa.

14. An apparatus for adjusting the sound pressure level of sound waves, the apparatus comprising:

an input configured to receive an audio signal from an overdriven amplifier, the audio signal including a plurality of frequencies;

an audio transducer configured to generate sound waves from the audio signal, the audio transducer including a voice coil disposed to receive the audio signal; and a sound pressure level (SPL) modulator, the SPL modulator configured, responsive to a user input, to modulate a flux density of a magnetic field that is applied to the voice coil so as to vary the sound pressure level of the sound waves that are generated by the audio transducer.

15. The apparatus of claim 14, wherein the (SPL) modulator includes a field coil, the flux density is modulated by modulating current in the field coil.

16. A method for adjusting the volume of an audio transducer while maintaining overtones generated in an overdriven amplifier, the method comprising:

providing a signal path between the overdriven amplifier and the audio transducer;

receiving the audio signal at the audio transducer, the audio signal including overtones generated by the overdriven amplifier, the audio transducer including a voice coil;

transducing the audio signal into audible sound waves, that include the overtones, with the transducer; and modulating a flux density of a magnetic field that is applied to the voice coil so as to adjust the volume of the sound waves that are output from the transducer without adversely affecting the audio signal in the signal path.

17. The method of claim 16, wherein modulating the flux density of the magnetic field that is applied to the voice coil includes electromagnetically modulating the flux density of the magnetic field that is applied to the voice coil.

* * * * *